(12) United States Patent
Wu

(10) Patent No.: US 6,218,261 B1
(45) Date of Patent: Apr. 17, 2001

(54) METHOD OF FABRICATING BOTTOM ELECTRODE

(75) Inventor: Yi-Tyng Wu, Chiayi (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/292,457

(22) Filed: Apr. 15, 1999

(51) Int. Cl.$^7$ .................................................. H01L 21/20
(52) U.S. Cl. ............................................. 438/398; 438/253
(58) Field of Search .................................... 438/253, 254, 438/258, 396, 397, 398, 706, 720, 745, 754

(56) References Cited

U.S. PATENT DOCUMENTS 5,943,584 * 6/2000 Shim et al. ......................... 438/398
6,074,910 * 6/2000 Lin ....................................... 438/253

* cited by examiner

Primary Examiner—David Nelms
Assistant Examiner—Quoc Hoang
(74) Attorney, Agent, or Firm—Martine Penilla & Kim, LLP

(57) ABSTRACT

A method of fabricating a bottom electrode is provided. A dielectric layer comprising a first opening is formed on the substrate. A conductive layer is formed on the dielectric layer to fill the first opening. A first patterned mask layer comprising a second opening is formed on the conductive layer. An isotropic etching step is performed on the conductive layer with the first patterned mask layer serving as a mask. A recess with a non-vertical sidewall is formed on the conductive layer under the second opening. The first patterned mask layer is removed. The conductive layer is patterned to form a bottom electrode with the recess. A hemispherical grained silicon layer is formed on the bottom electrode.

15 Claims, 5 Drawing Sheets

METHOD OF FABRICATING BOTTOM ELECTRODE

BACKGROUND OF THE INVENTION

1. Field of the Invention

The present invention relates to a semiconductor fabricating method. More particularly, the present invention relates to a method of forming a bottom electrode with an enlarged surface area.

2. Description of the Related Art

Because the integration of integrated circuits is increasing, it is important for the semiconductor industry to consider new manufacturing techniques that enable devices to be fabricated on a sub-micron scale. In a fabrication process for a dynamic random access memory (DRAM), the size of a DRAM capacitor needs to be reduced in order to decrease the planar area occupied by the capacitor. However, size reduction decreases the surface area of a bottom electrode of the DRAM capacitor. Hence, the charge-storage capacity of the capacitor is reduced.

One way to increase charge-storage ability of the DRAM capacitor is to use an HSG-Si layer for forming a bottom electrode. An electrode formed with the HSG-Si layer has a greater surface area, and therefore a greater capacitance for the capacitor is obtained because the HSG-Si layer provides a rough, granular surface.

FIGS. 1A through 1D are schematic, cross-sectional views showing a conventional method of fabricating a bottom electrode with an HSG-Si layer.

In FIG. 1A, a source/drain region 102 of a transistor (not shown) is formed in a substrate 100. A patterned dielectric layer 104 is formed on the substrate 100 to cover the source/drain region 102. The patterned dielectric layer 104 comprises an opening 105 exposing a portion of the source/drain region 102. A polysilicon layer 106 is formed on the dielectric layer 104 to fill the opening 105. The polysilicon layer 106 is electrically coupled with the source/drain region 102. An HSG-Si layer 108 is formed on the polysilicon layer 106.

In FIG. 1B, a patterned photoresist layer 110 is formed over the polysilicon layer 106 to cover the HSG-Si layer 108. The patterned photoresist layer 110 comprises an opening 112 that exposes a portion of the HSG-Si layer 108 on the polysilicon layer 106.

A dry etching step is performed with the patterned photoresist layer 110 serving as a mask. A portion of the HSG-Si layer 108 and the polysilicon layer 106 are removed to form a recess 114 with a vertical sidewall in the polysilicon layer 106. The photoresist layer 110 is removed to form a structure as shown in FIG. 1C.

In FIG. 1D, the polysilicon layer 106 and the HSG-Si layer 108 layer are patterned by a conventional photolithographic and etching process. A bottom electrode 106a with an HSG-layer 108a is formed.

In the above-described steps, the recess 114 with a vertical sidewall is formed in order to increase the surface area of the bottom electrode 106a in a fixed planar area. However, as shown in FIG. 1D, the increase surface area provided by the recess 114 with a vertical sidewall is small. Thus, the increase in bottom electrode 106a capacitance is limited. Moreover, the recess 114 is formed with a vertical sidewall, which causes difficulty during the subsequent ion implantation step. In the ion implantation step, it is difficult to amorphize the vertical sidewall of the recess 114. Thus, it is difficult to form an HSG-Si layer in the recess 114.

SUMMARY OF THE INVENTION

The invention provides a method of fabricating a bottom electrode. A semiconductor device is formed in a substrate. A dielectric layer is formed on the substrate. The dielectric layer comprises a first opening exposing a portion of the semiconductor device. A conductive layer is formed on the dielectric layer to fill the first opening, so as to couple with the semiconductor device. A first patterned mask layer comprising a second opening is formed on the conductive layer. The second opening exposes a portion of the conductive layer. An isotropic etching step is performed on the conductive layer with the first patterned mask layer serving as a mask. A recess with a non-vertical sidewall is formed in the conductive layer under the second opening. The planar area of the recess is larger than the planar area of the second opening. The first patterned mask layer is removed. The conductive layer is patterned to form a bottom electrode with the recess comprising a non-vertical sidewall. A hemispherical grained silicon layer is formed on the surface of the bottom electrode.

In one preferred embodiment of the invention, an anisotropic etching is performed after the step of performing the isotropic etching on the conductive layer with the first patterned mask layer serving as a mask, so as to form a trench in the conductive layer under a portion of the recess.

In another preferred embodiment of the invention, a second patterned mask layer is formed on the conductive layer. The second mask layer comprises a third opening exposing a portion of the conductive layer including the recess. An anisotropic etching step is performed with the second mask layer serving as a mask to remove a portion of the conductive layer.

The present invention performs the isotropic etching before the anisotropic etching step, so as to form the bottom electrode comprising a recess with a non-vertical sidewall. The surface area of the bottom electrode thus is increased by the recess in the bottom electrode. In comparison with the conventional method, the contour of the bottom electrode is easier for ion implantation when forming an HSG-Si layer on the bottom electrode. Thus, the formation of the HSG-Si layer is increased. The capacitance of the bottom electrode is effectively increased, as well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
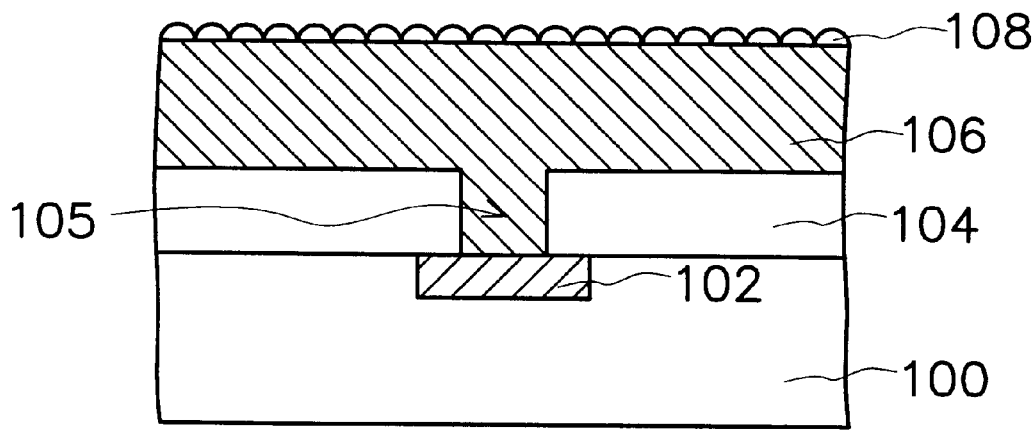
FIGS. 1A through 1D are schematic, cross-sectional views showing a conventional method of fabricating a bottom electrode with an HSG-Si layer.
Figure 1B:
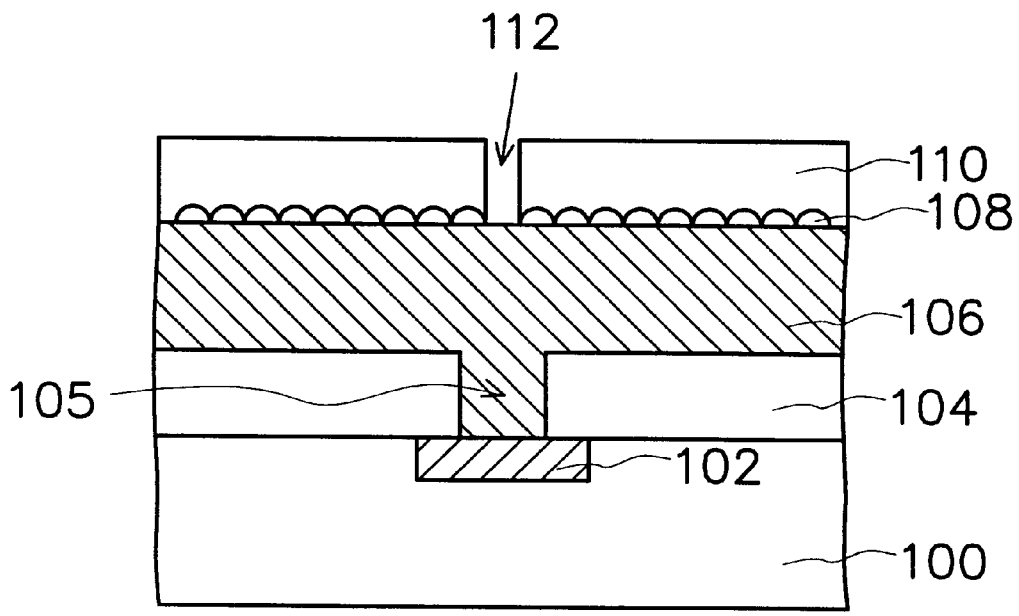
Figure 1C:
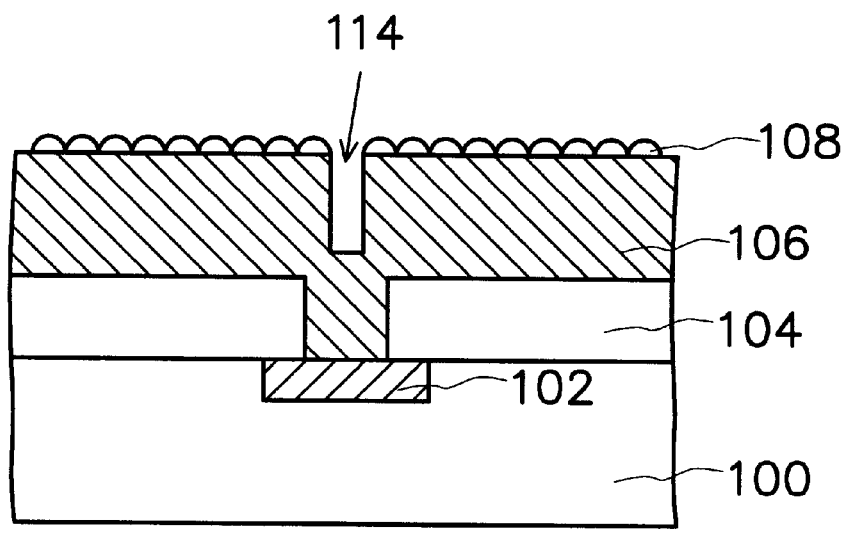
Figure 1D:
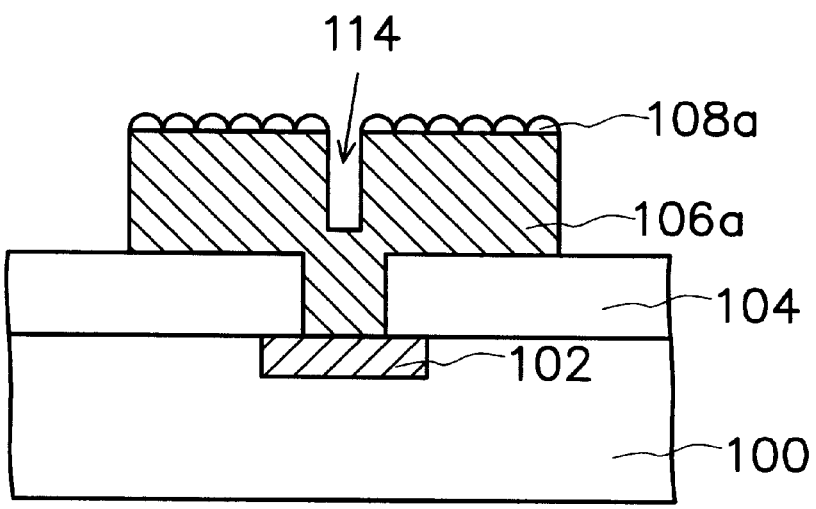

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views showing a method of fabricating a bottom electrode with an HSG-Si layer according to the preferred embodiment of the invention.

Figure 2A:
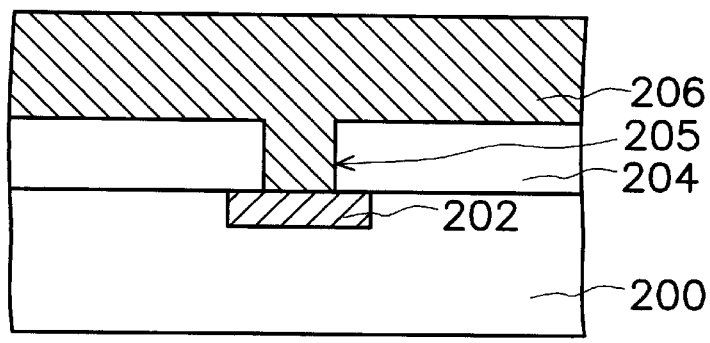
FIGS. 2A through 2F are schematic, cross-sectional views showing a method of fabricating a bottom electrode with an HSG-SI layer according to the preferred embodiment of the invention.

In FIG. 2A, a semiconductor device 202, such as a source/drain region, a conductive layer, or an interconnection, is formed in a semiconductor substrate 200. A patterned dielectric layer 204 comprising an opening 205 is formed on the substrate 200. Typically, a dielectric layer (not shown), such as a silicon oxide layer, is formed on the substrate 200 by, for example, chemical vapor deposition (CVD). A photolithographic and etching process is performed on the dielectric layer. The patterned dielectric layer 204 comprising the opening 205 thus is formed. The opening 205 exposes a portion of the semiconductor device 202. A conductive layer 206 is formed on the dielectric layer 204 to fill the opening 205, so as to couple with the semiconductor device 202. The conductive layer 206 having a preferred thickness of about 4000 angstroms to 10000 angstroms is formed by chemical vapor deposition. The material of the conductive layer 206 can be polysilicon, for example.

Figure 2B:
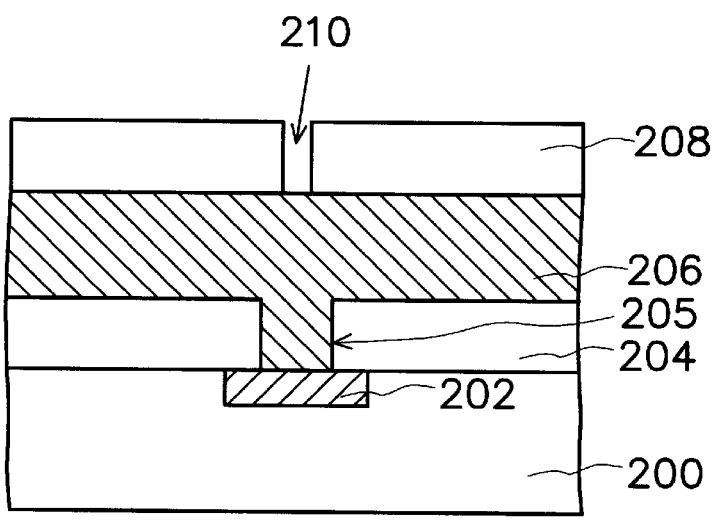

In FIG. 2B, a patterned mask layer 208 is formed on the conductive layer 206. The patterned mask layer 208 comprises an opening 210. The patterned mask layer 208 is preferably a photoresist layer, and is preferably patterned by a conventional photolithographic and etching process.

Figure 2C:
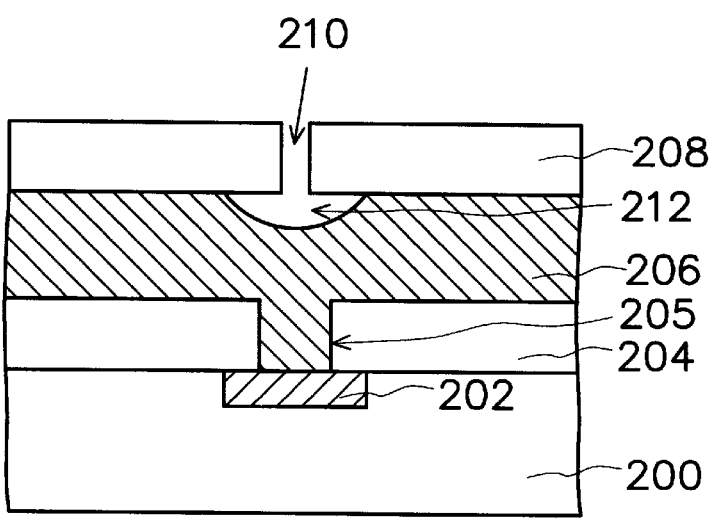

In FIG. 2C, an isotropic etching is performed with the patterned mask layer 208 serving as a mask. The isotropic etching is preferably a wet etching performed with $HNO_3$ and HF serving as an etchant. In the etchant, the ratio of $HNO_3$ to HF is 50:1. The etchant etches the conductive layer 206 through the opening 210. A recess 212 with a non-vertical sidewall thus is formed in a portion of the conductive layer 206. The planar area of the recess 212 is larger than the planar area of the opening 210.

Figure 2D:
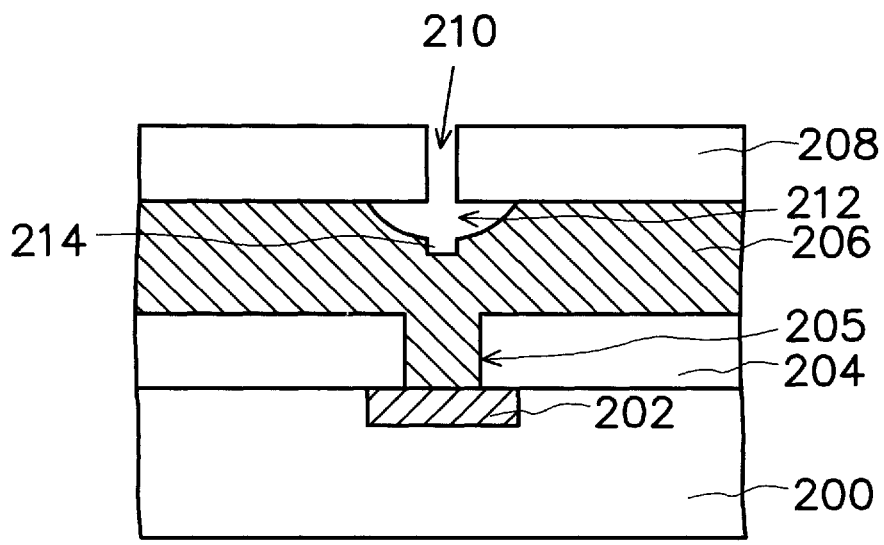

In FIG. 2D, an anisotropic etching is performed with the mask layer 208 serving as a mask. The conductive layer 206 exposed by the opening 210 is etched. A trench 214 is formed in the conductive layer 206 under a portion of the recess 212 with the non-vertical sidewall. The anisotropic etching can be, for example, dry etching.

Figure 2E:
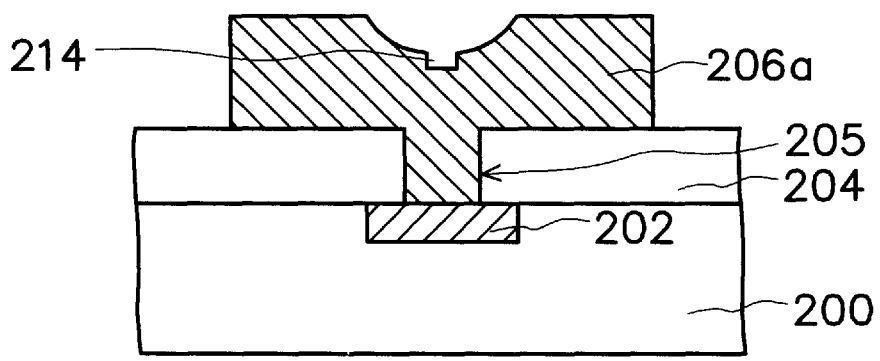

In FIG. 2E, the mask layer 208 is removed. The conductive layer 206 is patterned by a conventional photolithographic and etching process. A bottom electrode 206a with the recess 212 and the trench 214 is formed.

Figure 2F:
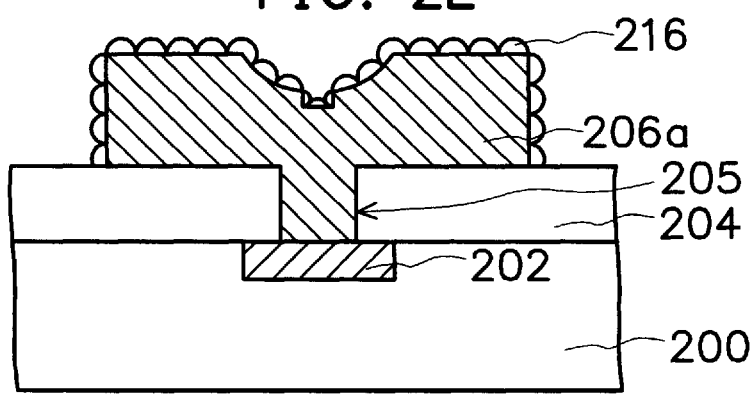

In FIG. 2F, an HSG-Si layer 216 is formed on the surface of the bottom electrode 206a. A bottom electrode 206a with the HSG-Si layer 216 is formed. The HSG-Si layer can be 216 formed by the following exemplary steps. An ion implantation step is performed. The surface of the bottom electrode 206a is amorphized. A grain growth step is performed. For example, a thermal step is performed in a vacuum environment. The HSG-Si layer 216 thus is formed by grain growth from the amorphous silicon.

The present invention performs the isotropic etching step before the anisotropic etching step in order to form the recess 212 in the conductive layer 206. In comparison with the conventional method, the surface area of the bottom electrode 206a is further increased. The capacitance of the bottom electrode 206a is correspondingly increased. Moreover, in comparison with the conventional method, the contour of the bottom electrode 206a with the recess 212 is more advantageous for ion implantation. Thus, compared with the conventional method, it is easier to form the HSG-Si layer 216 on the bottom electrode 206a.

Figure 3A:
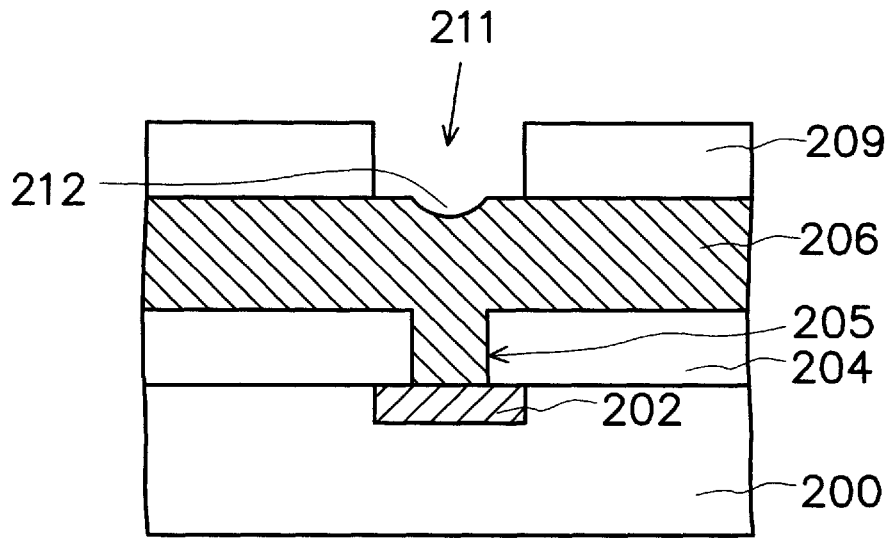
FIGS. 3A through 3C are schematic, cross-sectional views showing a method of fabricating a bottom electrode with an HSG-Si layer according to another preferred embodiment of the invention.
Figure 3B:
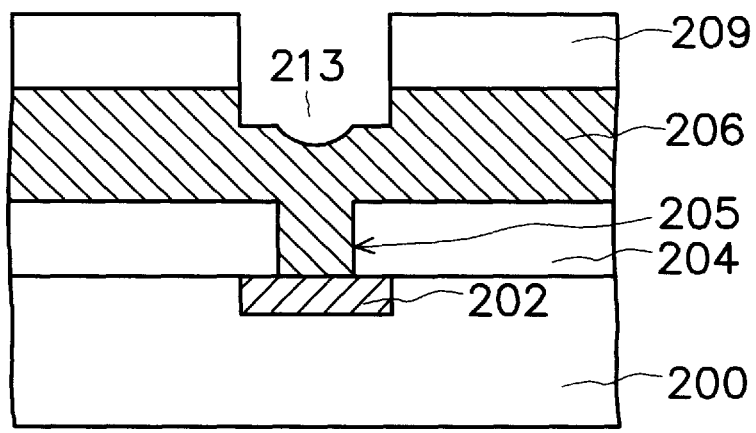
Figure 3C:
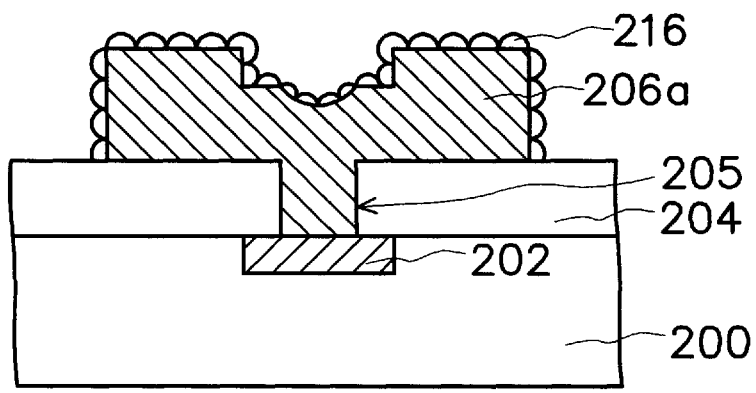

The anisotropic etching step of the present invention can also be performed in another way. Reference is made to FIGS. 3A through 3C, which explain another way of forming a bottom electrode with a different contour. FIG. 3A is performed following the steps illustrated in FIG. 2C. The reference numbers in FIG. 3A are the same as those in FIG. 2C.

In FIG. 3A, the mask layer 208 is removed after the recess 212 is formed. A patterned mask layer 209 comprising an opening 211 is formed on the conductive layer 206. The mask layer 209 is preferably a photoresist layer. Typically, the patterned mask 209 is patterned by a photolithographic and etching process. The opening 211 exposes a portion of the conductive layer 206 including the recess 212.

In FIG. 3B, an anisotropic etching is performed with the mask layer 209 serving as a mask. A portion of the conductive layer 206 is removed by, for example, dry etching. A certain thickness of conductive layer 206 exposed by the mask layer 209 is removed. Thus, after the anisotropic etching, an opening 213 is formed. A portion of the opening 213 still preserves the profile from the recess 212.

In FIG. 3C, the mask layer 209 is removed. The conductive layer 206 is patterned by a photolithographic and etching process. A bottom electrode 206a with the recess 212 is formed. An HSG-Si layer 216 is formed on the surface of the bottom electrode 206a, so as to increase the surface area of the bottom electrode 206a. The HSG-Si layer 216 can be formed by the following exemplary steps. An ion implantation step is performed on the bottom electrode 206a. The surface of the bottom electrode 206b thus is amorphized. A grain growth step is performed. For example, a thermal step is performed in a vacuum environment. The HSG-Si layer 216 is formed on the surface of bottom electrode 206a.

In summary, the invention includes at least the following advantages:

1. The present invention performs an isotropic etching before the anisotropic etching step, so as to form a bottom electrode with a recess comprising a non-vertical sidewall. The surface area of the bottom electrode thus is increased by the recess in the bottom electrode.

2. In comparison with the conventional method, the contour of the bottom electrode is easier for ion implantation in order to form an HSG-Si layer on the bottom electrode. Thus, the formation of HSG-Si layer is increased. The capacitance of the bottom electrode is effectively increased, as well. The device performance is enhanced.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a bottom electrode, comprising the steps of:

forming a semiconductor device in a substrate;

forming a dielectric layer on the substrate, wherein the dielectric layer comprises a first opening exposing a portion of the semiconductor device;

forming a conductive layer on the dielectric layer to fill the first opening, so as to couple the conductive layer with the semiconductor device;

forming a first patterned mask layer comprising a second opening on the conductive layer, wherein the second opening exposes a portion of the conductive layer;

performing an isotropic etching step on the conductive layer with the first patterned mask layer serving as a mask, wherein a recess with a non-vertical sidewall is formed in the conductive layer under the second opening, and the planar area of the recess is larger than the planar area of the second opening;

removing the first patterned mask layer;

patterning the conductive layer to form a bottom electrode having sidewalls and an upper surface with the recess; and forming a hemispherical grained silicon layer on the sidewalls and the upper surface of the bottom electrode.

2. The method of claim 1, further comprising performing an anisotropic etching step after performing the isotropic etching step on the conductive layer with the first patterned mask layer serving as a mask, so as to form a trench in the conductive layer under a portion of the recess.

3. The method of claim 1, further comprising forming a second patterned mask layer on the conductive layer after removing the patterned first mask layer, wherein the second mask layer comprises a third opening exposing a portion of the conductive layer including the recess; and performing an anisotropic etching step with the second mask layer serving as a mask to remove a portion of the conductive layer.

4. The method of claim 1, wherein the step of isotropic etching is performed by a wet etching with $HNO_3$ and HF serving as an etchant.

5. The method of claim 4, wherein a ratio of $HNO_3$ to HF is about 50:1.

6. The method of claim 1, wherein the conductive layer comprises a polysilicon layer.

7. The method of claim 1, wherein the semiconductor device comprises a field effect transistor.

8. The method of claim 1, wherein the semiconductor device comprises an interconnection.

9. A method of fabricating a bottom electrode, comprising the steps of:

forming a source/drain region in a substrate;

forming a dielectric layer over the substrate, wherein the dielectric layer comprises a first opening exposing a portion of the source/drain region;

forming a conductive layer on the dielectric layer to fill the first opening, so as to couple the conductive layer with the source/drain region;

forming a first patterned mask layer comprising a second opening on the conductive layer, wherein the second opening exposes a portion of the conductive layer;

performing an isotropic etching step on the conductive layer with the first patterned mask layer serving as a mask, wherein a recess with a non-vertical sidewall is formed on the conductive layer under the second opening, and the planar area of the recess is larger than the planar area of the second opening;

removing the first patterned mask layer;

patterning the conductive layer to form a bottom electrode having sidewalls and an upper surface with the recess;

performing an ion implantation step to amorphize the sidewalls and the upper surface of the bottom electrode; and performing a grain growth step to form a hemispherical grained silicon layer on the sidewalls and the upper surface of the bottom electrode.

10. The method of claim 9, further comprising performing an anisotropic etching after the step of performing the isotropic etching on the conductive layer with the first patterned mask layer serving as a mask, so as to form a trench in the conductive layer under the recess.

11. The method of claim 9, further comprising forming a second patterned mask layer on the conductive layer after removing the patterned first mask layer, wherein the second mask layer comprises a third opening exposing a portion of the conductive layer including the recess; and performing an anisotropic etching step with the second mask layer serving as a mask to remove a portion of the conductive layer.

12. The method of claim 9, wherein the isotropic etching is performed by wet etching with $HNO_3$ and HF as an etchant.

13. The method of claim 12, wherein the ratio of $HNO_3$ to HF is about 50:1.

14. The method of claim 9, wherein the conductive layer comprises a polysilicon layer.

15. The method of claim 9, wherein the step of grain growth is performed by a thermal step in a vacuum environment.

* * * * *